US011004710B2

(12) United States Patent
Mungekar et al.

(10) Patent No.: US 11,004,710 B2
(45) Date of Patent: May 11, 2021

(54) WAFER PLACEMENT ERROR DETECTION BASED ON MEASURING A CURRENT THROUGH AN ELECTROSTATIC CHUCK AND SOLUTION FOR INTERVENTION

(71) Applicant: Applied Materials, Inc., Santa Clara, CA (US)

(72) Inventors: Hemant Mungekar, Campbell, CA (US); Ganesh Balasubramanian, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 39 days.

(21) Appl. No.: 16/431,564

(22) Filed: Jun. 4, 2019

(65) Prior Publication Data
US 2020/0388518 A1   Dec. 10, 2020

(51) Int. Cl.
*H01J 37/32* (2006.01)
*H01L 21/66* (2006.01)
*H01L 21/67* (2006.01)
*H01L 21/683* (2006.01)
*H01L 21/68* (2006.01)

(52) U.S. Cl.
CPC .. *H01L 21/67259* (2013.01); *H01J 37/32174* (2013.01); *H01J 37/32715* (2013.01); *H01J 37/32926* (2013.01); *H01L 21/67253* (2013.01); *H01L 21/67288* (2013.01); *H01L 21/68* (2013.01); *H01L 21/6833* (2013.01); *H01L 22/14* (2013.01)

(58) Field of Classification Search
CPC . H01L 21/6833; H01L 21/6831; H01L 22/20; H01J 37/32926; H01J 2237/24564
See application file for complete search history.

(56) References Cited

U.S. PATENT DOCUMENTS

| | | | | |
|---|---|---|---|---|
| 8,075,730 | B2* | 12/2011 | Shimura | H01L 21/67178 156/345.32 |
| 8,419,859 | B2* | 4/2013 | Fukiage | C23C 16/4405 134/1.1 |
| 8,937,800 | B2* | 1/2015 | Lubomirsky | H01L 21/67103 361/234 |
| 9,620,337 | B2* | 4/2017 | Valcore, Jr. | H01J 37/32926 |
| 9,842,725 | B2* | 12/2017 | Valcore, Jr. | H01J 37/32926 |
| 2005/0225923 | A1* | 10/2005 | Howald | H01L 21/6833 361/234 |
| 2016/0118227 | A1* | 4/2016 | Valcore, Jr. | H01J 37/32183 216/61 |
| 2017/0280509 | A1* | 9/2017 | Takebayashi | H01L 21/67103 |
| 2019/0252224 | A1* | 8/2019 | Oka | H01J 37/32174 |

(Continued)

*Primary Examiner* — Bradley Smith
*Assistant Examiner* — David J Goodwin
(74) *Attorney, Agent, or Firm* — Lowenstein Sandler LLP

(57) ABSTRACT

Methods and systems of detection of wafer placement error in a semiconductor processing chamber are disclosed. Methods and systems of interdiction are also disclosed to prevent hardware and wafer damage during semiconductor fabrication if and when a wafer placement error is detected. The method—is based on measuring a slope of current in an electrostatic chuck (ESC), which is correlated to lack of contact between the wafer and the ESC. Wafer placement detection at an early stage, when a heater and an ESC are being set up, gives the option of stopping the process before high power RF plasma is created.

20 Claims, 7 Drawing Sheets

(56) References Cited

U.S. PATENT DOCUMENTS

| | | | |
|---|---|---|---|
| 2019/0259674 A1* | 8/2019 | Howald | H01L 21/67069 |
| 2020/0037399 A1* | 1/2020 | Zhang | H01L 21/67103 |
| 2020/0194290 A1* | 6/2020 | Gopalan | H01L 21/6838 |
| 2020/0194299 A1* | 6/2020 | Balasubramanian | H01J 37/32715 |
| 2020/0388518 A1* | 12/2020 | Mungekar | H01L 21/67259 |

* cited by examiner

WAFER PLACEMENT ERROR DETECTION BASED ON MEASURING A CURRENT THROUGH AN ELECTROSTATIC CHUCK AND SOLUTION FOR INTERVENTION

TECHNICAL FIELD

The present disclosure generally relates to detection of wafer placement error and methods and systems of interdiction to prevent hardware and wafer damage during semiconductor fabrication.

BACKGROUND

In semiconductor processing chambers that use high power plasma processes, there is a risk of damage of certain chamber hardware if the hardware comes in contact with the plasma in an unintended way. A substrate-holder (also referred to as "wafer chuck" or simply "chuck") that holds a wafer may have heaters to raise the temperature of the wafer as required by a particular process recipe. This heater or substrate holder also offers electrical ground to the plasma used in PECVD deposition or etch reactor. For intended process control and to prevent damage to hardware and/or wafer, the wafer should be placed centrally in x-y plane (i.e. the center of the wafer is properly aligned with the chuck), and/or when there is proper contact established between the chuck and the wafer in the z-direction. In case of an electrostatic chuck (ESC), the proper chucking in z-direction may depend on the accuracy of x-y plane placement. However, a robot may fail to place the wafer perfectly at the center of the chuck. Additionally or alternatively, the wafer may have some 'bow' that prevents proper contact with the chuck and the heater. This not only exposes the heater to the high power plasma, causing damage of the heater/faceplate, but also may result in undesirable coating on the backside of the wafer to the extent the wafer needs to be discarded altogether.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

Methods and systems of detection of wafer placement error in a semiconductor processing chamber are disclosed. Methods and systems of interdiction are also disclosed to prevent hardware and wafer damage during semiconductor fabrication if and when a wafer placement error is detected. In an embodiment, a method is based on measuring a slope of current in an electrostatic chuck (ESC), which is correlated to lack of contact between the wafer and the ESC. Wafer placement detection at an early stage, when a heater and an ESC are being set up, gives the option of stopping the process before high power RF plasma is created.

Specifically, a computer-implemented method (and corresponding system) for damage prevention for a semiconductor processing chamber configured to run a high-power plasma process is described. The method comprises, prior to creating a high-power plasma, placing a wafer on an electrostatic chuck (ESC); powering the ESC; creating a low-power plasma in the processing chamber at a first radio frequency (RF) power level substantially lower than a second RF power level that is required to create a high-power plasma; measuring a current through the ESC while the low-power plasma is on; calculating a slope of the measured current; comparing the slope of the measured current to a predetermined threshold indicative of a wafer chucking error; and, performing a damage prevention action responsive to the comparison indicating that the slope of the measured current exceeds the predetermined threshold value indicative of the wafer chucking error.

BRIEF DESCRIPTION OF THE DRAWINGS

The present disclosure will be understood more fully from the detailed description given below and from the accompanying drawings of various implementations of the disclosure.

DETAILED DESCRIPTION

Aspects of the present disclosure are directed to systems and methods of early detection of wafer placement error in a semiconductor processing chamber. Loss of wafer contact is also known as "de-chucking." When the wafer is de-chucked or about to get de-chucked, high power plasma may damage unprotected hardware components of the substrate-holder as well the wafer itself. The systems and methods taught herein enable interdiction to prevent hardware and wafer damage during semiconductor fabrication if a wafer placement error is detected, which may lead to complete or partial de-chucking.

Presently, a wafer placement error is detected after a wafer is at least partially processed in a processing chamber. Current post-processing error detection methods include measuring edge overlay error from the devices being fabricated on the wafer. Some other existing methods measure electrostatic chuck current or wafer backside cooling flow changes—when such hardware and sensing is available, while the wafer is being processed. Post-processing, detecting whether there is unintended deposition in the backside of the wafer or robot hand-off error while recovering wafer from the chamber can be used to detect that wafer was misplaced during processing. Both the post-processing methods do not help to understand at what point the misplacement happened in the processing, and by the time the misplacement is detected, it is already too late to take corrective action to prevent damage to the product wafer and/or the processing chamber hardware.

Both planar offset (in x-y plane) and lack of contact in z-direction are detrimental to the substrate-holder hardware underneath the wafer, as well as to the wafer itself, because of undesired phenomena (such as, arcing) associated with high power plasma in the processing chamber. This disclosure describes methods where wafer placement error is detected fairly early, so that the currently ongoing process can be stopped before the high power plasma is formed, and the erroneous situation can be corrected before starting the process again.

The substrate-holder of this disclosure may have an integrated heater. The heater heats up the wafer to a temperature prescribed by the plasma process recipe. An example high power plasma process may be plasma enhanced chemical vapor deposition (PECVD), though other processes, such as plasma etching, plasma cleaning etc. are within the scope of the disclosure. In one method disclosed herein, the wafer placement error is detected early during the heating step as part of setting up the substrate-holder, i.e. before the high power plasma process starts. The high power plasma process starts when the high radio frequency (RF) power is turned on and the precursor gases start flowing into the chamber to create the plasma.

Figure 1A:
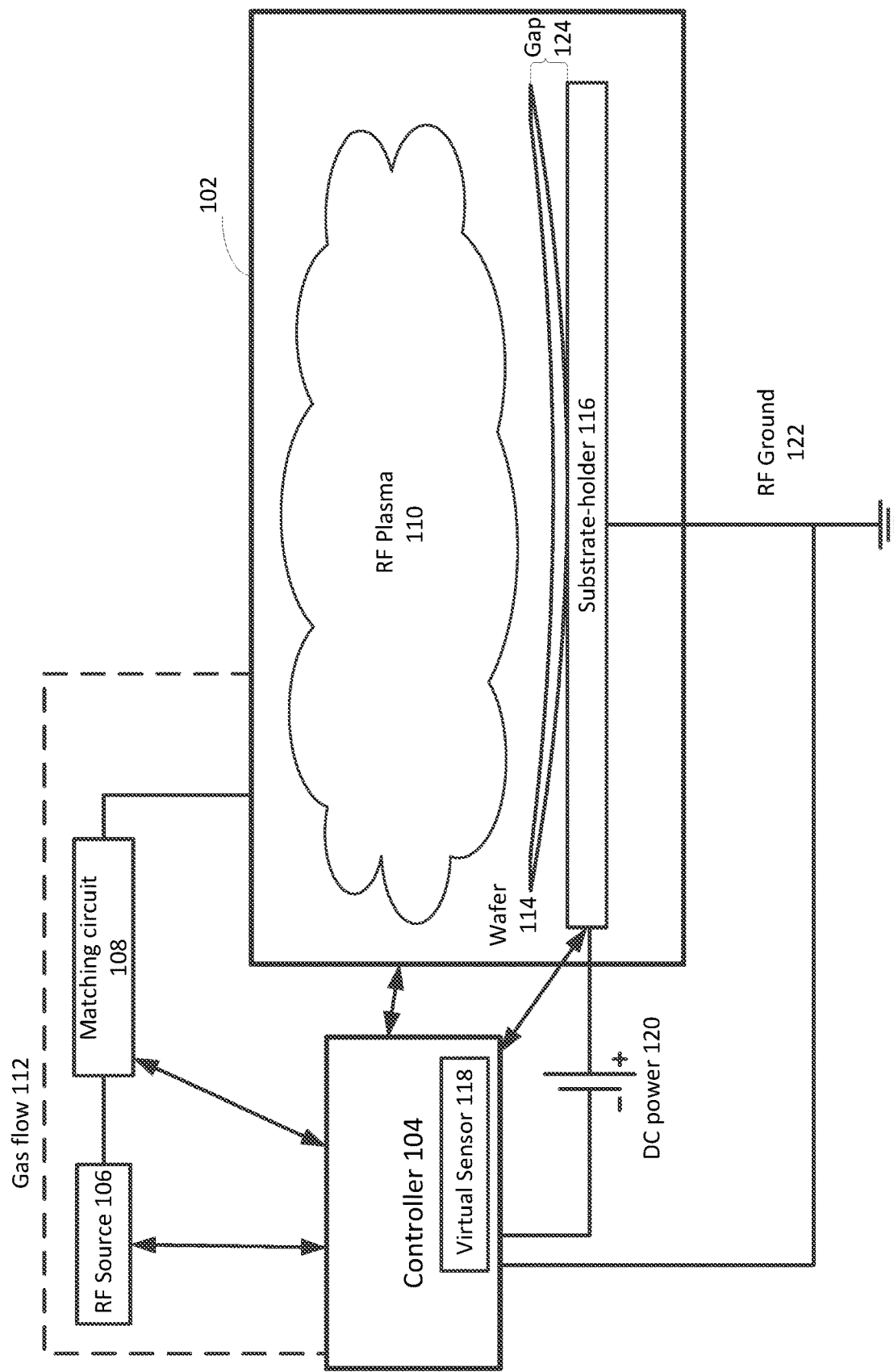
FIG. 1A is a schematic of a plasma processing system, in accordance with some embodiments of the present disclosure.

FIG. 1A is a schematic of a plasma processing system with a variety of sensors, in accordance with some embodiments of the present disclosure. The term "virtual sensor" is used to describe a processor 118 that processes data derived from direct measurements performed by real sensors. ESC current measurement data is provided to the virtual sensor. The wafer placement error is calculated by the processor from a derived slope of the measured ESC current.

Referring back to FIG. 1A, a processing chamber 102 is controlled by a tool controller 104 during initial set-up of the chamber 102 for a plasma process and during the subsequent high power plasma process itself. There is a high power RF source 106 (e.g., power level can be in the range of or in excess of 2000 W) comprising a RF generator controlled by an RF source controller (not shown separately for simplicity). In one embodiment, the RF source controller can be a component within the RF source 106, and is communicatively coupled to the tool controller 104. A matching circuit 108 may also be communicatively coupled to the tool controller 104. RF source 106 powers a plasma circuit. The plasma circuit includes a high power RF plasma 110 created adjacent to a wafer 114 within the chamber 102. The plasma circuit includes various components in between the RF source 106 and the RF ground 122, including the matching circuit 108, the RF plasma 110 and other components integral to the processing chamber 102. The tool controller 104 also controls precursor gas flow 112 into the chamber 102 to create the plasma 110.

The wafer 114 is held by a substrate-holder 116. The substrate-holder can comprise an electrostatic chuck (ESC). ESC can be a platen with electrodes biased with a DC voltage to establish electrostatic holding force to keep a wafer in place with respect to a substrate-holder. Ideally, there should not be any gap between the wafer 114 and the substrate-holder 116. However, due to improper chucking and/or excessive wafer bow, there may be an undesirable finite gap 124 between the wafer 114 and the substrate-holder 116. Because of this gap, arcing may happen between the wafer and the substrate-holder when high power RF plasma 110 is on, and the arcing may damage exposed portions of the substrate-holder (including the heater and the faceplate) as well as the wafer itself. Also, undesired coating may adhere to the backside of the wafer as plasma reaches the gap 124. An additional sensor may be included to measure a bow of the wafer, based on which a power of the DC source that powers the ESC can be varied to adjust the electrostatic chucking force. In one embodiment, prior to placing a wafer on the ESC, the incoming bow is measured, and power of the DC source is adjusted accordingly. Additionally, or alternatively, the bow of the wafer is monitored as a current plasma process progresses in time, and power of the DC source is adjusted according to the monitored bow of the wafer to adjust the electrostatic chucking force required to maintain contact with the ESC.

Figure 1B:
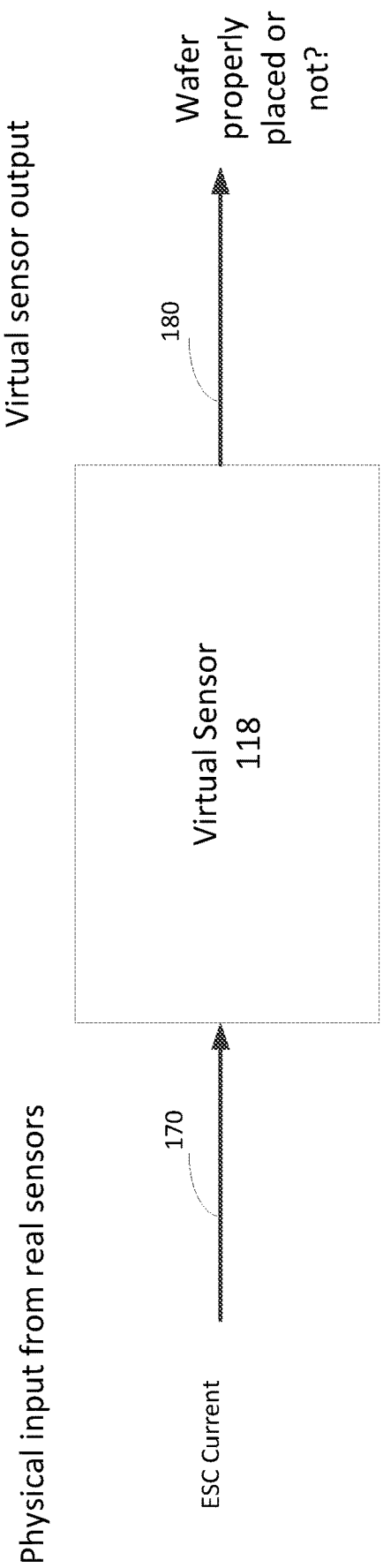
FIG. 1B is a block diagram of virtual sensor inputs and outputs, in accordance with some embodiments of the present disclosure.

The substrate-holder 116 may have a path to RF ground 122. In case of an electrostatic chuck (ESC), a DC power source 120 is coupled to the substrate-holder 116 to create an electrostatic force that holds down the wafer. The DC power source may be a monopolar source or a bipolar source. One or more input parameters, including ESC current 170 (derived from measurements by a current sensor) are sent to a virtual sensor 118 in the tool controller 104, as shown in FIG. 1B. The processor in the virtual sensor 118 runs algorithms using the physical input received from the real sensors to detect whether the wafer is properly placed or not. Based on the output 180 of the virtual sensor 118, appropriate preventive action may be taken by the system.

FIGS. 2-5 pertains to a wafer misplacement detection method based on measuring ESC current ($I_{ESC}$). This method leverages a correlation between wafer placement error and a change in slope of $I_{ESC}$ with time ($dI_{ESC}/dt$) to decide whether to stop a process without turning the high power plasma on or whether to continue the process. $I_{ESC}$ varies depending on how good the contact is between the wafer and the ESC.

Figure 2:
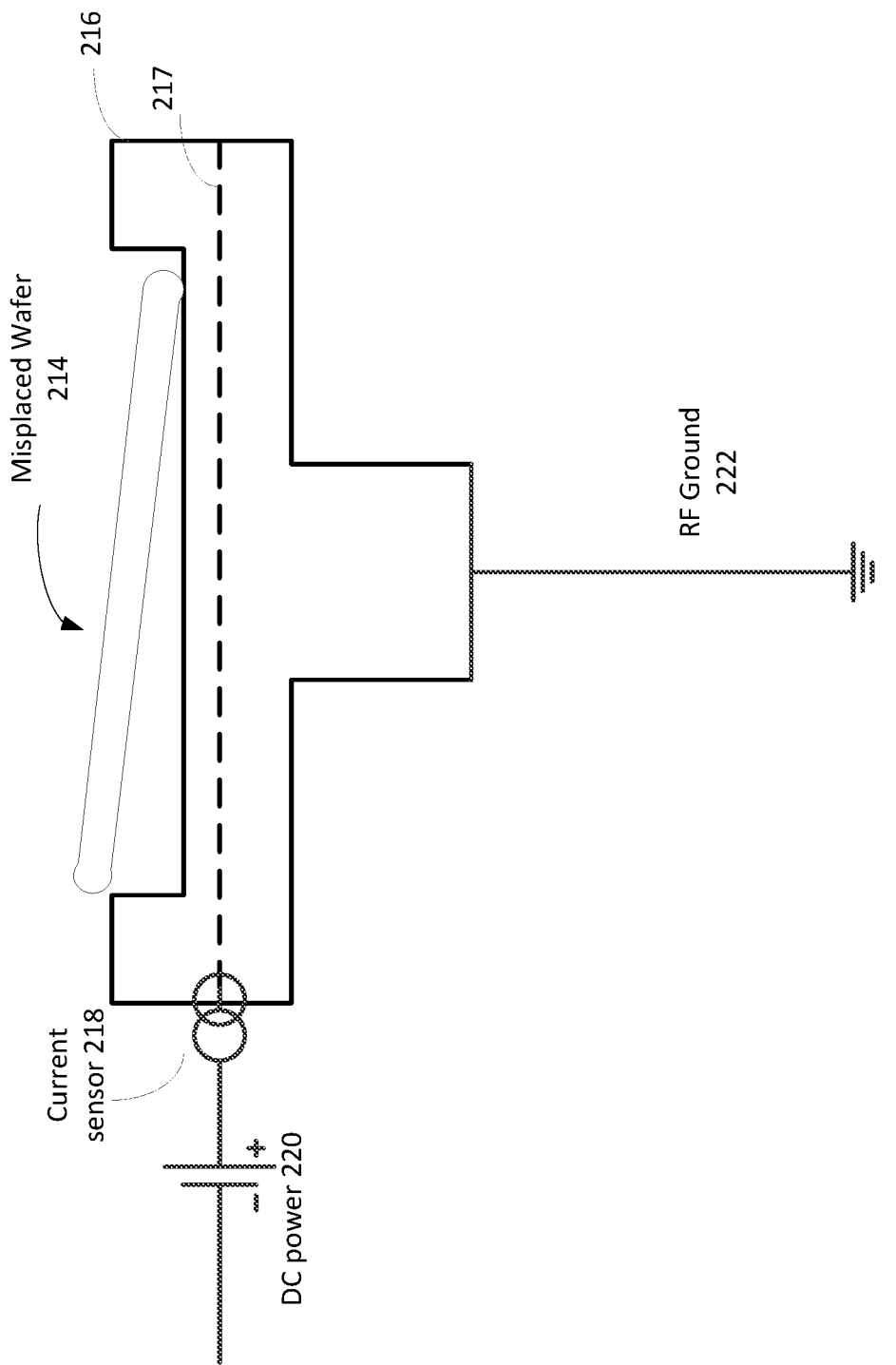
FIG. 2 shows a current sensor in the ESC that detects lack of proper chucking of a wafer high power RF is on, according to an embodiment of this disclosure.

FIG. 2 shows a substrate holder 216 within a processing chamber. The processing chamber is not shown in FIG. 2 for clarity, but is similar to what is shown in FIG. 1A. The substrate holder 216 has an electrostatic chuck (ESC) component 217 built into it. A current sensor 218 measures current in the ESC (referred to as $I_{ESC}$). DC power source 220, and RF ground 222 are equivalent to corresponding elements 120 and 122 in FIG. 1A. The wafer 214 is misplaced because of lack of electrostatic clamping, preventing the wafer from having proper contact with the substrate-holder 216. The lack of contact may have been caused by inherent properties of the wafer (i.e. wafer bow, as shown in FIG. 1A), or may have been caused by off-center placement of the wafer that results in uneven electrostatic clamping force.

Figure 3:
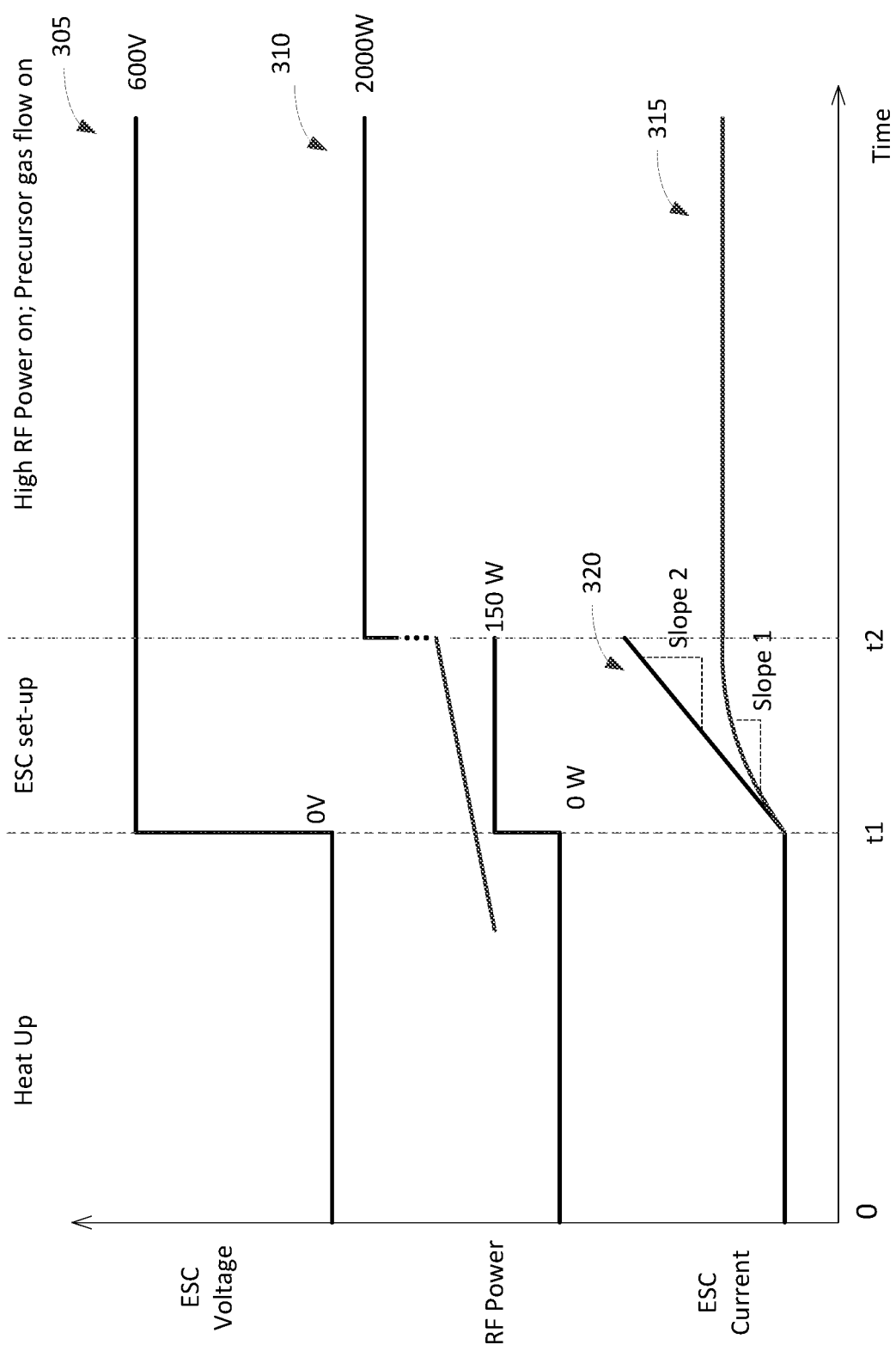
FIG. 3 shows plots of various process parameters measured by the virtual sensors in a plasma chamber, according to an embodiment of this disclosure.

FIG. 3 shows plots of relevant process parameters at different stages of a high-power plasma process as time increases. Note that the numerical values shown in the plots are for illustration only, and do not limit the scope of the disclosure. There are two set-up stages in FIG. 3: a heat-up stage (from t=0 to t=$t_1$), and an ESC set-up stage (from t=$t_1$ to t=$t_2$). Note that during the ESC set-up stage, the RF power level ("first RF power level") is substantially lower than the RF power level that is required to create a high-power plasma ("second RF power level."). For example, the second RF power level may be at least double the first RF power level, though typically the second RF power level is more than ten times the first RF power level. For example, the first RF power level may be 150 W, where the second RF power level may be 2000 W.

The top plot 305 is a plot of the ESC voltage. Initially in the heat-up stage, the ESC voltage is zero. At t=$t_1$, the DC power supply is turned on. A typical ESC voltage is 600V, which is maintained steady throughout the plasma process $t_1$ onwards.

The middle plot 310 is a plot of the RF power that is used to eventually create a high-power plasma if no error is detected. At the heat-up stage, the RF power is off. At this stage, a temperature-based error detection method may be used. At the ESC set-up stage, the RF power is on (at t1 or slightly after t1 but sufficiently before t2), but the power level is kept low (at around 150-200 W) to prevent creating a high power plasma. Rather a low power plasma is created with gases other than the precursor gases. At this stage, the ESC current-based error detection method is used. The ESC current is the leakage current due to the ESC electrode being exposed directly to the low-power plasma due to misplaced wafer. No precursor gas is flown into the processing chamber during any of these two set-up stages. Once the ESC set-up stage is completed at $t=t_2$, and it is determined that it is safe to continue the high power plasma process, high RF power (typically in the range of or in excess of 2000 W) is turned on and the precursor gases are flown into the chamber to create a plasma adjacent to the wafer, as shown in FIG. 1A.

The bottom plots 320 and 315 are the ESC current plots, as measured by a current sensor, such as current sensor 218 shown in FIG. 2. If the slope of the ESC current is lower than a certain threshold (i.e. in case of the plot 315, slope 1<threshold slope), as measured during the ESC set-up period between time instances $t_1$ and $t_2$, then the high RF power is turned on at time $t_2$. The slope is measured at least over a time period of 3-5 seconds. If the slope of the ESC current is higher than a certain threshold (i.e. in case of the plot 320, slope 2>threshold slope), as measured during the ESC set-up period between the time instances $t_1$ and $t_2$, then there is a wafer placement error (in this case lack of proper chucking) that needs to be corrected. Therefore, the high RF power is not turned on. In short, by calculating the current slope during the ESC set-up period and comparing the current slope to a threshold slope, the method disclosed herein cuts off the process altogether, or, corrects the position of the wafer first before processing it with high power RF plasma.

Figure 4:
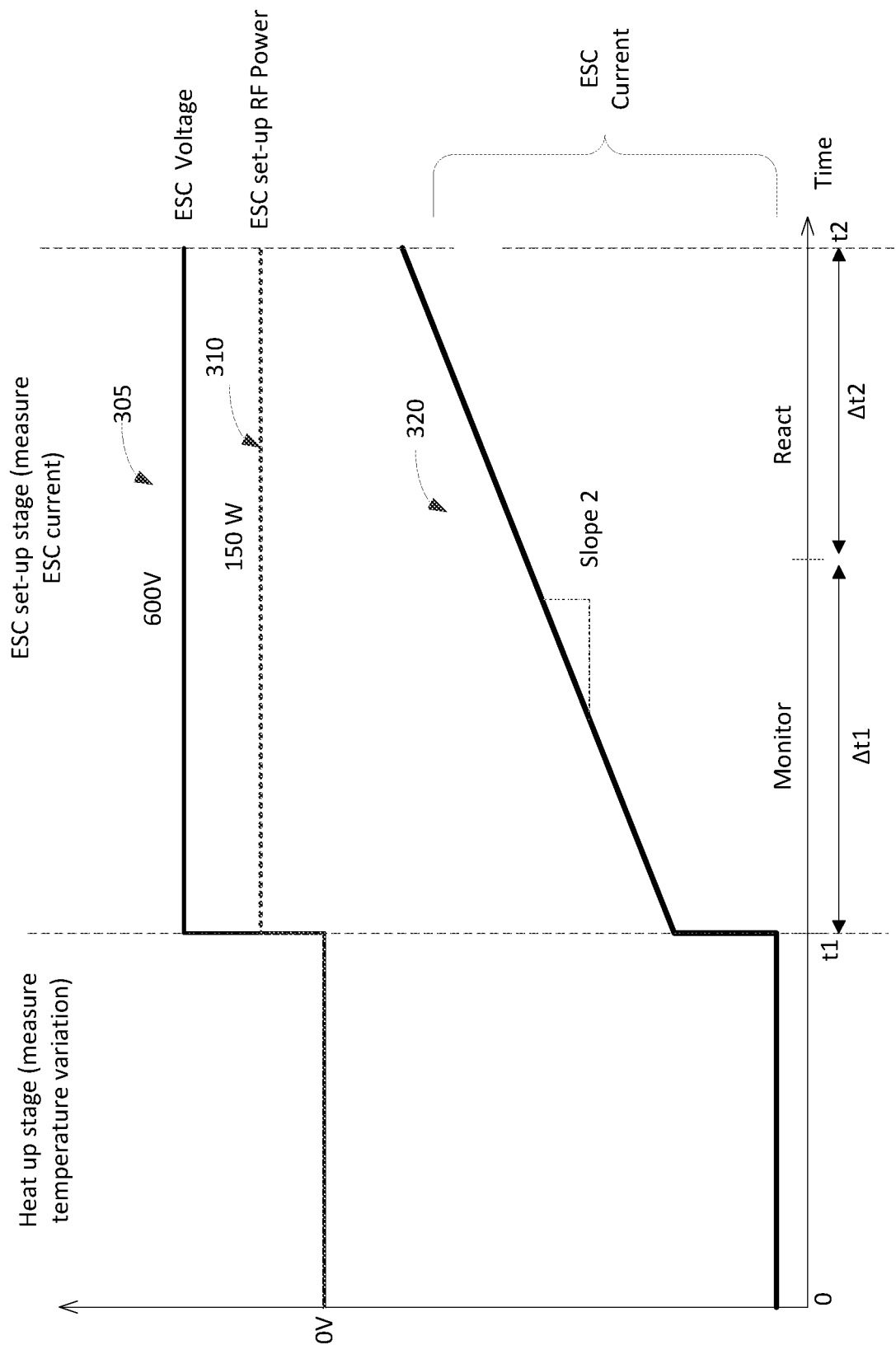
FIG. 4 shows further details of a plot of the ESC current whose slope exceeds a threshold, according to an embodiment of this disclosure.

FIG. 4 shows a close up of what happens between the time instances $t_1$ and $t_2$, i.e. during the ESC set-up period. The ESC set-up period is divided between two sub-periods: monitor time ($\Delta t_1$), and react time ($\Delta t_2$). Illustrative values of $\Delta t_1$ and $\Delta t_2$ may be 3 sec and 2 sec, though the disclosure is not limited by particular values of time periods. The slope of ESC current is preferably measured during the monitor time, so that there is time to react before the high RF power is turned on. Typically, if the slope ($dI_{ESC}/dt$) is greater than a predetermined threshold value 'S', then the disclosed method intervenes and stops further processing. A non-limiting illustrative value of the threshold value 'S' is 8 mA/sec, i.e. if slope 2 is greater than 8 mA/sec, the process is stopped, when the RF power is still kept at the lower value (150-200 W range) rather than jumping up to the 2000 W range. The threshold may be known from experience (either through controlled experiment or through historical data collected from already damaged wafers).

Figure 5:
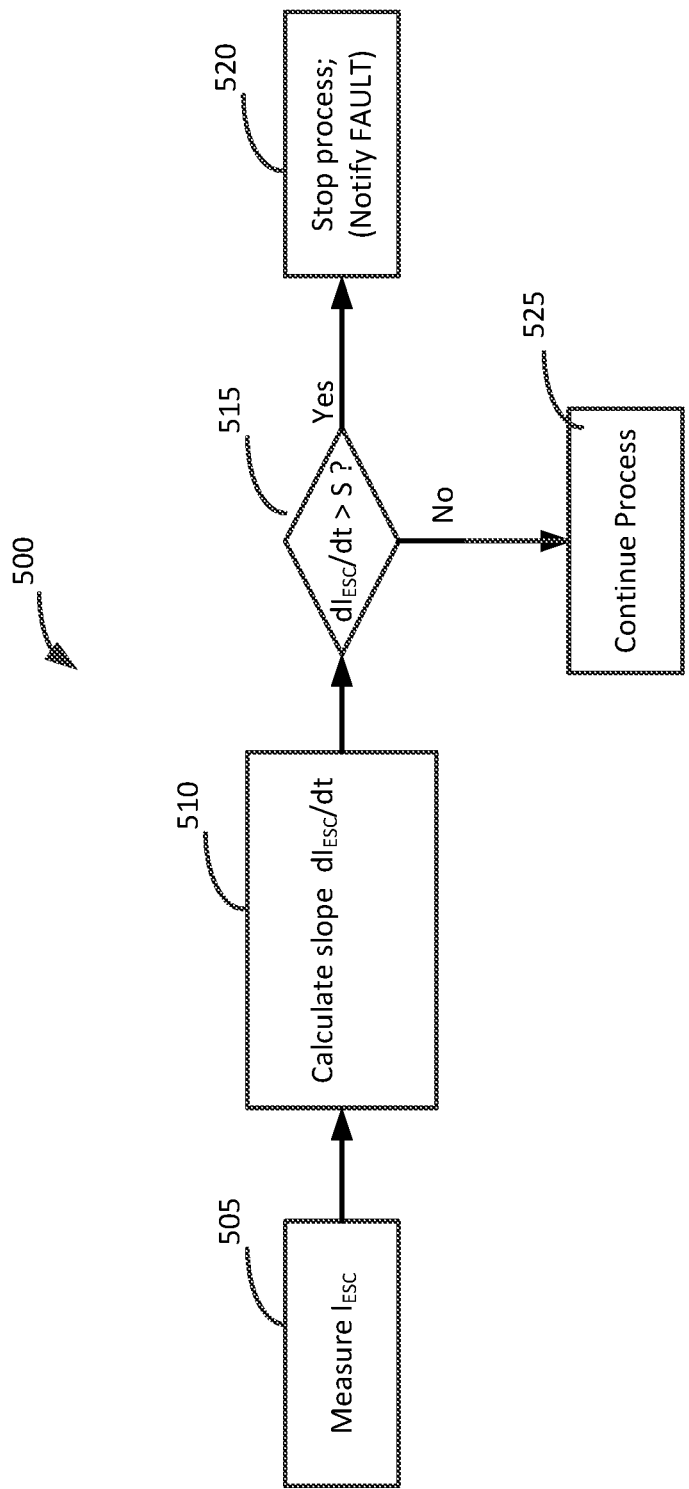
FIG. 5 shows a flow diagram of an example method for interdiction based on monitoring the slope of the ESC current, according to an embodiment of this disclosure.

FIG. 5 is a flow diagram of an example method 500 to enable intervention based on ESC current slope measurement, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes in method 500 or other methods described herein with illustrative flowcharts can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In method 500, at block 505, a current though the ESC ($I_{ESC}$) is measured with the wafer on the ESC while the low power plasma is on and the ESC is powered. At block 510, the slope ($dI_{ESC}/dt$) is calculated. In block 515, the value of the calculated slope ($dI_{ESC}/dt$) is compared with a predefined threshold value 'S' (where a slope value greater than 'S' is indicative of a wafer chucking error). Responsive to the comparison in block 515, the method proceeds either to block 520 or to block 525. For example, if the determination is positive at block 515, i.e., ($dI_{ESC}/dt$)>S, then the method proceeds to block 520, where a suitable damage prevention action is performed. For example, the process may be stopped, and optionally, a notification can be disseminated by the system that the wafer placement is faulty. If the determination is negative at block 515, i.e., ($dI_{ESC}/dt$)<S, the semiconductor process is continued (block 525), i.e. full RF power is turned on. Note that, in alternative embodiments, instead of stopping the process, a warning message may be displayed, and the user will have an option of stopping the process, or continue the process.

In summary, the method described herein detects wafer placement error, which may be in the form of planar x-y offset or in the form of wafer tilt in z-direction, or both. A current-measurement-based method is used to detect wafer placement error early, thereby preventing processing a wafer in a faulty condition which may lead to hardware and/or wafer damage. Measurement from current sensors, optionally combined with measurement from other sensors, such as temperature sensors, provides for an effective stoppage method with high-confidence, i.e. interdiction is fast enough to prevent damage to substrate-holder hardware and/or the wafer itself. Proximity to the processing chamber allows for fast interdiction. Therefore, the methods described herein can be executed in the chamber mainframe controller, e.g., controller 104 shown in FIG. 1A.

Figure 6:
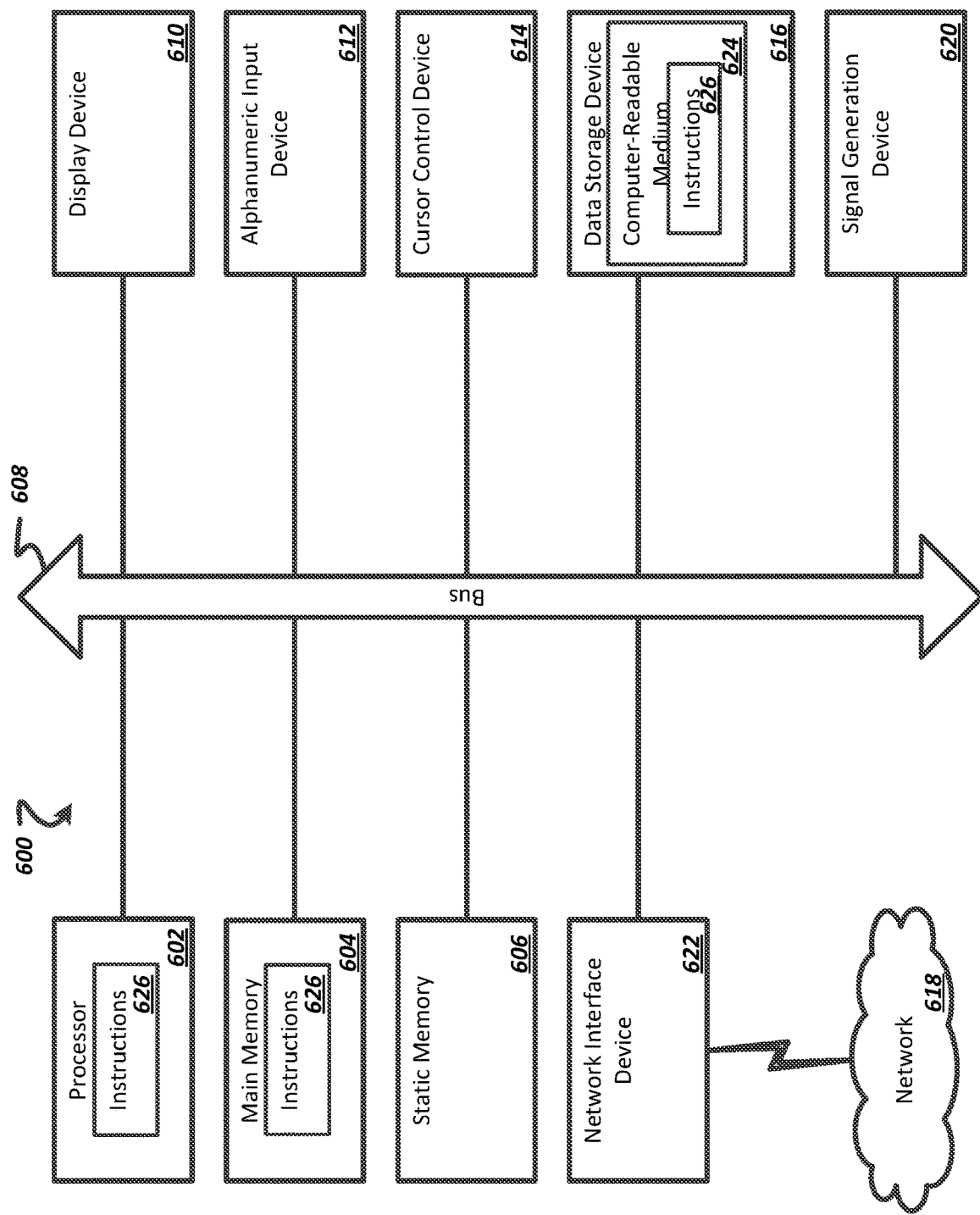
FIG. 6 shows a simplified environment within which the methods and systems of the present disclosure may be implemented.

FIG. 6 illustrates an example machine of a computer system 600 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) etc.), a static memory 606 (e.g., flash memory, static random access memory (SRAM), etc.), and a data storage device 616, which communicate with each other via a bus 608.

Processing device 602 represents one or more general-purpose processing devices such as a microprocessor, a central processing unit, or the like. In certain embodiments, the processing device 602 may comprise virtual sensor 118 shown in FIGS. 1A-1B. More particularly, the processing device may be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device 602 may also be one or more special-purpose processing devices such as an application specific integrated circuit (ASIC), a field programmable gate array (FPGA), a digital signal processor (DSP), network processor, or the like. The processing device 602 is configured to execute instructions for performing the operations and steps discussed herein.

The computer system 600 may further include a network interface device 622 to communicate over the network 618. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse or a touch pad), a signal generation device 620 (e.g., a speaker), a graphics processing unit (not shown), video processing unit (not shown), and audio processing unit (not shown).

The data storage device 616 may include a machine-readable storage medium 624 (also known as a computer-readable medium) on which is stored one or more sets of instructions or software embodying any one or more of the methodologies or functions described herein. The instructions may also reside, completely or at least partially, within the main memory 604 and/or within the processing device 602 during execution thereof by the computer system 600, the main memory 604 and the processing device 602 also constituting machine-readable storage media.

In one implementation, the instructions include instructions to implement functionality corresponding to a height difference determination. While the machine-readable storage medium 624 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "identifying" or "determining" or "executing" or "performing" or "collecting" or "creating" or "sending" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct a more specialized apparatus to perform the method. The structure for a variety of these systems will appear as set forth in the description below. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, implementations of the disclosure have been described with reference to specific example implementations thereof. It will be evident that various modifications may be made thereto without departing from the broader spirit and scope of implementations of the disclosure as set forth in the following claims. The specification and drawings are, accordingly, to be regarded in an illustrative sense rather than a restrictive sense.

What is claimed is:

1. A computer-implemented method of damage prevention for a semiconductor processing chamber configured to run a high-power plasma process, the method comprising, prior to creating a high-power plasma:
    placing a wafer on an electrostatic chuck (ESC);
    powering the ESC;
    creating a low-power plasma in the processing chamber at a first radio frequency (RF) power level substantially lower than a second RF power level that is required to create a high-power plasma;
    measuring a current through the ESC while the low-power plasma is on;
    calculating a slope of the measured current;
    comparing the slope of the measured current to a predetermined threshold value indicative of a wafer chucking error; and
    performing a damage prevention action responsive to the comparison indicating that the slope of the measured current exceeds the predetermined threshold value indicative of the wafer chucking error.

2. The method of claim 1, wherein creating the low power plasma comprises:
    selecting one or more precursor gases for the high-power plasma process; and
    flowing one or more gases other than the selected precursor gases in the processing chamber.

3. The method of claim 1, wherein the damage prevention action comprises: stopping a currently ongoing process without proceeding to create the high-power plasma.

4. The method of claim 1, wherein the damage prevention action comprises:
    notifying that the processing chamber is unsafe for high-power plasma processing.

5. The method of claim 1, further comprising:
    responsive to the comparison indicating that the slope of the measured current is below the predetermined threshold value indicative of the wafer chucking error, proceeding to create the high-power plasma.

6. The method of claim 5, wherein proceeding to create the high-power plasma comprises:
    increasing the RF power level to the second RF power level which is substantially higher than the first RF power level; and
    flowing precursor gases in the processing chamber.

7. The method of claim 6, further comprising:
    continuing to monitor the current through the ESC when the high-power plasma is on.

8. A system comprising:
    a semiconductor processing chamber;
    an electrostatic chuck (ESC) inside the semiconductor processing chamber and configured to chuck a wafer;
    a plasma source configured to create plasma inside the semiconductor processing chamber, wherein the plasma source creates a low-power plasma at a first RF power level substantially lower than a second RF power level that is required to create a high-power plasma; and
    a non-transitory computer-readable medium storing instructions, the instructions executable by a processor to:
    prior to creating the high-power plasma,
        measure a current through the ESC while the low-power plasma is on;
        calculate a slope of the measured current;
        compare the slope of the measured current to a predetermined threshold value indicative of a wafer chucking error; and
        perform a damage prevention action responsive to the comparison indicating that the slope of the measured current exceeds the predetermined threshold value indicative of the wafer chucking error.

9. The system of claim 8, wherein to perform the damage prevention action, the processor is further to:
    stop a currently ongoing process without proceeding to create the high-power plasma.

10. The system of claim 8, wherein to perform the damage prevention action, the processor is further to:
    notify that the semiconductor processing chamber is unsafe for high-power plasma processing.

11. The system of claim 8, wherein the processor is further to:
    responsive to the comparison indicating that the slope of the measured current is below the predetermined threshold value indicative of the wafer chucking error, send a signal to the plasma source to proceed to create the high-power plasma.

12. The system of claim 11, wherein upon receiving the signal to proceed to create high-power plasma, the plasma source is further to:
    increase the RF power level to the second RF power level which is substantially higher than the first RF power level.

13. The system of claim 11, the processor is further to:
    responsive to the comparison indicating that the slope of the measured current is below the predetermined threshold value indicative of the wafer chucking error, send a signal to initiate flow of precursor gases in the processing chamber.

14. The system of claim 12, wherein the processor is further to:
    continue to monitor the current through the ESC when the high-power plasma is on.

15. A non-transitory computer-readable medium storing instructions, the instructions executable by a processor to:
    prior to creating a high-power plasma within a semiconductor processing chamber having an electrostatic chuck (ESC) therein to chuck a wafer,
    measure a current through the ESC while a low-power plasma is on, wherein a plasma source creates a low-power plasma at a first RF power level substantially lower than a second RF power level that is required to create the high-power plasma;
    calculate a slope of the measured current;
    compare the slope of the measured current to a predetermined threshold value indicative of a wafer chucking error; and
    perform a damage prevention action responsive to the comparison indicating that the slope of the measured current exceeds the predetermined threshold value indicative of the wafer chucking error.

16. The non-transitory computer-readable medium of claim 15, wherein to perform the damage prevention action, the processor is further to:
    stop a currently ongoing process without proceeding to create the high-power plasma.

17. The non-transitory computer-readable medium of claim 15, wherein to perform the damage prevention action, the processor is further to:
    notify that the semiconductor processing chamber is unsafe for high-power plasma processing.

18. The non-transitory computer-readable medium of claim 15, wherein the processor is further to:
responsive to the comparison indicating that the slope of the measured current is below the predetermined threshold value indicative of the wafer chucking error, send a signal to the plasma source to proceed to create the high-power plasma.

19. The non-transitory computer-readable medium of claim 18, wherein upon receiving the signal to proceed to create high-power plasma, the plasma source increase the RF power level to the second RF power level which is substantially higher than the first RF power level.

20. The non-transitory computer-readable medium of claim 19, wherein the processor is further to:
continue to monitor the current through the ESC when the high-power plasma is on.

* * * * *